United States Patent [19]

Day et al.

[11] Patent Number: 5,334,461
[45] Date of Patent: Aug. 2, 1994

[54] PRODUCT FORMED BY METHOD OF CONTROLLING RESISTIVITY OF PLATED METAL

[75] Inventors: Melanie A. Day, Dryden; Ronald A. Kaschak, Vestal, both of N.Y.; Steven A. Schubert, Tucson, Ariz.

[73] Assignee: International Business Machines, Inc., Armonk, N.Y.

[21] Appl. No.: 794,368

[22] Filed: Nov. 13, 1991

Related U.S. Application Data

[60] Continuation of Ser. No. 421,349, May 19, 1988, abandoned, which is a division of Ser. No. 889,661, Jul. 28, 1986, Pat. No. 4,756,923.

[51] Int. Cl.$^5$ .......................... B32B 5/14; B32B 15/20
[52] U.S. Cl. ........................ 428/610; 428/931; 428/936
[58] Field of Search .............. 428/606, 607, 615, 610, 428/674, 931, 936; 148/432, 11.5 C

[56] References Cited

U.S. PATENT DOCUMENTS

| | | | |
|---|---|---|---|
| 3,395,089 | 7/1968 | Mayer et al. | 204/192 |
| 3,793,717 | 2/1974 | Degenkolb et al. | 29/610 |
| 4,331,702 | 5/1982 | Hieber et al. | 427/10 |
| 4,338,351 | 7/1982 | Bloom et al. | 427/8 |
| 4,479,980 | 10/1984 | Acosta et al. | 427/10 |
| 4,495,558 | 1/1985 | Cath et al. | 364/563 |
| 4,543,576 | 9/1985 | Hieber et al. | 427/8 |
| 4,623,554 | 11/1986 | Kaschak et al. | 427/8 |
| 4,869,971 | 9/1989 | Nee et al. | 428/635 |

FOREIGN PATENT DOCUMENTS

| | | | |
|---|---|---|---|
| 58-141372 | 8/1983 | Japan | 427/8 |
| 60-219476 | 11/1985 | Japan | 428/931 |

*Primary Examiner*—John Zimmerman
*Attorney, Agent, or Firm*—Bernard Tiegerman; Kenneth P. Johnson

[57] ABSTRACT

Method and product resulting therefrom of controlling the residual resistivity of an electrolessly deposited metal by first, calculating the mathematical relationship between the residual resistivity of the deposited metal and its rate of deposition and second, depositing said metal at a rate to produce a predetermined residual resistivity.

4 Claims, 1 Drawing Sheet

PRODUCT FORMED BY METHOD OF CONTROLLING RESISTIVITY OF PLATED METAL

This application is a continuation of application Ser. No. 421,349, filed May 19, 1988, now abandoned which is a division of application Ser. No. 889,661, filed Jul. 28, 1986, now U.S. Pat. No. 4,756,923, granted Jul. 12, 1988.

FIELD OF THE INVENTION

This invention relates generally to the plating of metals, and more particularly to control of resistivity of the metal during the plating process.

BACKGROUND OF THE INVENTION

Electrical resistivity of plated metals is of foremost significance and concern in circuit fabrication, such as in the construction of printed and integrated circuits. Achievement of the lowest possible electrical resistance in the conductive current paths with accompanying circuit integrity are among the more important and continuing goals. These characteristics can be obtained only through close monitoring and control during the metal deposition processes. Successful, uniform plating capability has developed into a highly skilled art.

The resistivity of metals is influenced by many factors, including material lattice structure, impurity content and temperature. In circuit fabrication by additive plating processes, copper is one of the primary metals used because of its relatively low resistivity and favorable ductility. In additive processes, the metal is selectively deposited on a substrate by immersion in a plating bath that may be either an autocatalytic electroless bath, or an electroplating bath. The autocatalytic bath process is slow with copper, for instance, being deposited at the rate of 0.002 millimeters per hour. The bath formulation and plating process are critical to plating performance and are carefully controlled to insure and maintain bath stability, plating uniformity, and desired electrical and mechanical characteristics of the metal.

Electrical resistivity, a measure of the metal's ability to conduct an electric current, can be separated into two components. One is the ideal temperature-dependent resistivity due to lattice vibrations, and the other is the residual resistivity due to impurities and lattice imperfections. At any given temperature, the ideal temperature-dependent resistivity is constant but the total resistance can vary among specimens of the same metal depending upon the magnitude of the residual resistance. It then becomes apparent that total resistivity can be changed only by altering the residual resistivity component.

This residual resistivity can be decreased in smelted metals by further refinement to improve the purity. Plated metals are not amenable to this processing and their residual resistivities have not been generally considered a controllable property.

OBJECTS AND SUMMARY OF THE INVENTION

It is accordingly a primary object of this invention to provide a method of controlling the residual resistivity of a metal, that is, resistivity due to impurities and lattice imperfections, when deposited on a substrate.

A further important object of this invention is to provide a method of plating metal on a substrate that permits variation of inherent properties of the metal as it is being deposited on a substrate.

Another significant object of this invention is to provide a method of defining particular desired values of residual resistivity for a plated metal and achieving those values during the plating process.

Yet another object of this invention is to provide a plated metal having predetermined but variable values of residual resistivity.

A still further object of this invention is to provide an improved method of plating metal having a higher purity than heretofore possible.

The foregoing objects are attained in accordance with this invention by determining the relationship between the value of residual resistivity as a physical property of a deposited metal and the rate at which the metal was deposited, and thereafter plating the metal onto a workpiece at a rate that will produce the desired resistivity value for the metal. This method of choosing the residual resistivity of a plated metal can be used to enable creation of a resistance profile of the metal that differs across its thickness by altering the plating rate during deposition. Metal purity and the number of imperfections in the lattice structure change as a result of the deposition rate change and the residual resistivity can be selected for a plated layer. The quality of the deposited layer can therefrom be specified or predicted. Other properties apparently are not adversely affected by the plating rate changes. The invention further permits improved plating efficiencies through shortened processing times.

The foregoing and other objects, features and advantages of the invention will be apparent from the following more particular description of a preferred embodiment of the invention considered in conjunction with the accompanying drawing.

DESCRIPTION OF THE PREFERRED EMBODIMENT

Figure 1:
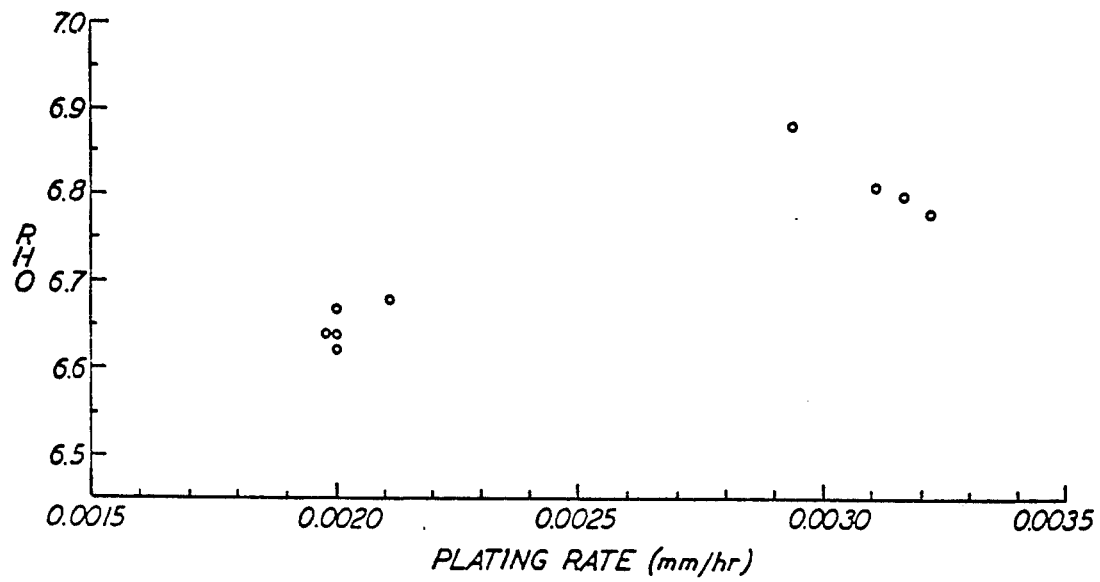
FIGS. 1 and 2 are graphs of plating rates versus ratios of the resistances measured for plated copper samples, with each ratio calculated from the resistances measured at two different temperatures, and illustrate the effect of rate changes on residual resistivity.

Additive construction of circuit conductors is frequently accomplished by immersion of a selectively sensitized substrate in an autocatalytic or electroless plating bath. For copper, the bath will typically contain constituents such as a metal source of copper sulfate, a pH adjuster such as sodium hydroxide, a ductility promoter such as sodium cyanide, a reducing agent such as formaldehyde, a commercial wetting agent and a complexing agent such as ethylenediamine tetra acetic acid, all held in a temperature range of 60° to 80° C. Copper atoms will deposit from the solution onto the previously prepared substrate surfaces. The deposition rate is slow and immersion must be continued for several hours to build the necessary metal thicknesses. Proportionalities of bath constituents change with use and, even with replenishment, the bath stability, rate and quality of the metal deposition are not constant. The quality of metal plated from autocatalytic baths has long been thought to trap the fewest impurities and provide the maximum conductivity when the plating rate was moderate permitting the bath to be maintained at its most stable condition, that is, not to suddenly plate out onto all surfaces in an uncontrolled manner.

It has been discovered, however, that both the purity and molecular structure of the deposited metal are improved at faster plating rates. Whereas 0.002 millimeters of plated copper per hour is a typical and established plating rate for copper baths, it has been found that bath metal purity and molecular lattice structure, both affecting residual resistivity, are benefited by faster deposition at up to twice the normal rates, such as 0.003 to 0.004 nun/hr. An inverse relationship apparently exists between the plating rate and residual resistivity; as the deposition rate increases, the residual resistivity decreases. The specific relationship can differ, however, from bath to bath.

Resistivity $\rho$ of the metal can be separated into two components as follows:

$$\rho = \rho_T + \rho_0 \quad (1)$$

Where $\rho_T$ is the ideal temperature-dependent resistivity due to the lattice vibrations and $\rho_0$ is the residual resistivity due to impurities and lattice imperfections. At a given temperature, $\rho_T$ is constant but the total resistivity can vary depending on the magnitude of $\rho_0$. The characteristic residual resistivity relationship of a particular plating bath can be determined by applying the so-called "RHO" tests to samples plated under the same conditions but at different rates. RHO testing is accomplished by measuring the D.C. resistance R of a sample of plated metal at two different temperatures T1 and T2 and ratioing the results as:

$$RHO = \frac{R_1}{R_2} = \frac{\rho_{T1} + \rho_0}{\rho_{T2} + \rho_0} \quad (2)$$

Where T1 and T2 are usually the temperatures of ice water (273° K.) and liquid nitrogen (80° K.), respectively. The residual resistivity $\rho_0$ can be solved for by rearranging equation (2):

$$\rho_0 = \frac{\rho_{T1} - \rho_{T2}(R_1/R_2)}{R_1/R_2 - 1} \quad (3)$$

It ham been determined that the value of the residual resistivity $\rho_0$ for autocatalytic copper plating baths decreases with increasing plating rates. This results in the value of RHO increasing in magnitude with a faster plating rate. Such a result is opposite to an intuitive expectation because the typical assumption is that higher rates of electroless metal deposition will trap or entrain more impurities and thereby increase residual, hence, total resistance.

This unusual result can be illustrated by examples:

EXAMPLE 1

An autocatalytic copper plating bath was initially maintained in the following manner: the constituent concentrations affecting plating rate were formaldehyde at 2.2 to 3.0 milliliters per liter, copper at 8.8 to 9.4 grams per liter, and cyanide at 9.0 to 13.5 milliliters per liter. RHO monitors of epoxy-glass fiber substrates, each with a circuit path sensitized by immersion in stannous chloride and palladium chloride solutions, were immersed in the bath for 12-hour periods. This bath produced plating rates between 0.00198 and 0.00200 mm/hr. of copper plating. Resistance was then measured using a four-point probe system and RHO values of 6.62 to 6.67 were exhibited. Thereafter, the constituent concentration necessary for higher plating rates were provided and maintained with formaldehyde at 2.4 to 3.4 ml/l, copper at 9.6 to 10.0 g/l, and cyanide at 11.0 to 18.5 mg/l. These constituent changes produced copper deposition rates of 0.0029 to 0.0032 mm/hr. and RHO values of 6.78 to 6.88. The RHO values versus plating rate are shown in FIG. 1 in the two groups resulting from plating rate differences.

EXAMPLE 2

A second autocatalytic copper plating bath was varied as to constituent concentrations to effect plating rates as follows: formaldehyde concentration was maintained at 2.6 to 4.1 ml/l, copper at 6.0 to 8.5 g/l and cyanide at 7.0 to 14.6 mg/l.

Again, substrates of epoxy-glass fibers with sensitized circuit paths were immersed for 12-hour periods. The second bath produced plating rates of 0.0021 to 0.0022 mm/hr. RHO values using the four-point probe system mentioned above were found to be 6.53 to 6.60.

Figure 2:
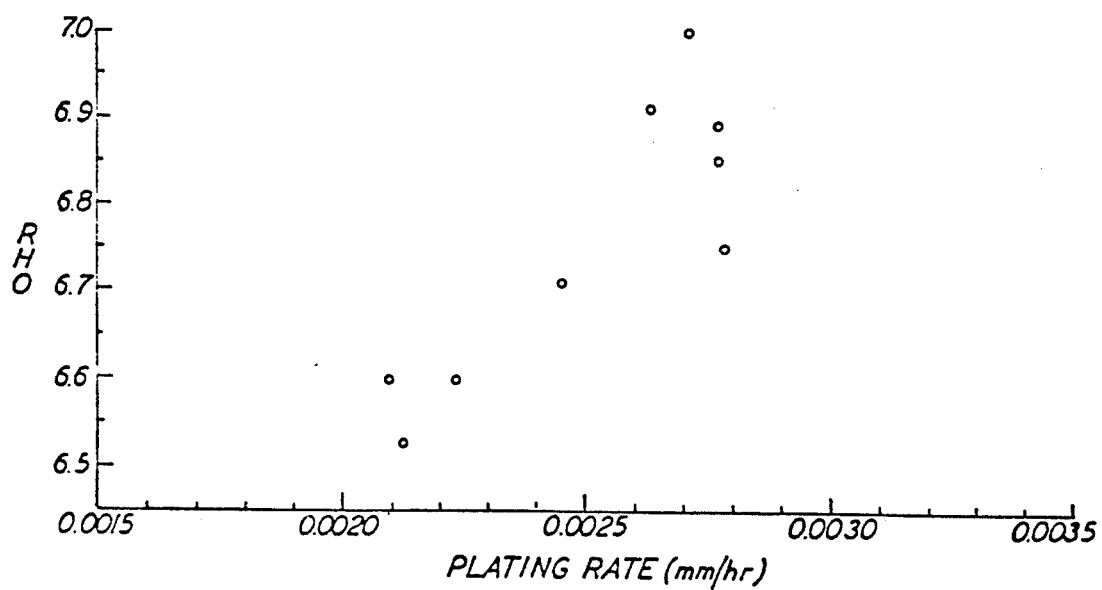

The concentrations were then changed to promote faster plating and formaldehyde was maintained between 3.4 and 4.4 ml/l, copper at 6.0 to 8.7 g/l and cyanide at 9.3 to 18.6 mg/l. The plating rates increased and were from 0.0026 to 0.0028 mm/hr. RHO values at this higher rate ranged from 6.75 to 7.00. The RHO values versus plating rates for the second bath are shown in FIG. 2.

Plated copper deposited in the foregoing examples had a constant bright, shiny appearance irrespective of the deposition rates. There were no changes in ductility or substrate adhesion as a result of using different plating rates. From all test data and observations, the purity of the plated metal improved and other properties and qualities of the plating and of the metal remained constant throughout the faster plating rates of the exemplary baths.

Bath plating rates depend primarily on concentrations of reducing agents used, but manipulation of other bath parameters can also affect the plating rate. In the above examples, formaldehyde was the primary agent. Other baths may use sodium borohydride or another such agent or combination. The particular proportions must be limited to those levels that will not produce bath decomposition.

It will be seen from the foregoing description and test results that an increase in deposition rate of metal from an autocatalytic bath produces the very desirable reaction of lower residual resistivity. This characteristic is extremely desirable because of lower energy losses due to resistance and less circuit fabrication time. Plated metal with specific residual resistivities can be achieved through rate variations. Thus, by first determining the relationship between residual resistivity and variations in plating rate, a particular resistivity can be obtained by merely controlling the plating rate of a bath for depositing a metal. This obviously permits the desired residual resistivity profile of a conductor to be varied over its cross section and over its length. The disclosed technique of resistance variation now enables some control over the resistance of plated metal. Heretofore a change in the resistance of copper, for example, could be achieved only through annealing, a process clearly not suitable for printed circuit fabrication.

While the invention has been particularly shown and described with reference to a preferred embodiment thereof, it will be understood by those skilled in the art that changes in form and details may be made therein without departing from the spirit and scope of the invention.

What is claimed is:

1. A metal formed in accordance with a method comprising the steps of:

determining the variable relationship between the magnitude of a residual resistivity of a metal when autocatalytically plated onto a substrate and the rate of plating said metal; and autocatalytically plating said metal at least three distinct, selected rates of deposition to produce a desired, non-uniform residual resistivity profile over the cross section of the metal, which profile includes at least three distinct, corresponding residual resistivities.

2. The product of claim 1 wherein said plated metal is upper.

3. A metal formed in accordance with a method comprising the steps of:

determining the variable relationship between a purity of a metal when electrolessly plated onto a substrate and the rate of plating said metal; and electrolessly plating said metal at least three distinct, selected rates of deposition to produce a desired, non-uniform purity over the cross section of the plated metal, which profile includes at least three distinct, corresponding levels of purity.

4. The metal as deposited in accordance with claim 3, wherein the metal is copper.

* * * * *